United States Patent
Yamasaki et al.

(10) Patent No.: US 7,356,059 B2
(45) Date of Patent: Apr. 8, 2008

(54) NITRIDE SEMICONDUCTOR LASER DEVICE AND SEMICONDUCTOR OPTICAL DEVICE

(75) Inventors: Yukio Yamasaki, Daito (JP); Shigetoshi Ito, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 462 days.

(21) Appl. No.: 10/497,018

(22) PCT Filed: Nov. 25, 2002

(86) PCT No.: PCT/JP02/12286

§ 371 (c)(1), (2), (4) Date: Jan. 21, 2005

(87) PCT Pub. No.: WO03/047056

PCT Pub. Date: Jun. 5, 2003

(65) Prior Publication Data

US 2005/0117616 A1   Jun. 2, 2005

(30) Foreign Application Priority Data

Nov. 28, 2001 (JP) ............... 2001-362863

(51) Int. Cl.
*H01S 3/00* (2006.01)
*H01S 5/00* (2006.01)
*H01S 3/097* (2006.01)

(52) U.S. Cl. .............. 372/38.04; 372/43.01; 372/81

(58) Field of Classification Search .......... 372/38.04, 372/43.01, 81
See application file for complete search history.

(56) References Cited

U.S. PATENT DOCUMENTS 5,777,350 A * 7/1998 Nakamura et al. ......... 257/96
6,043,514 A * 3/2000 Teraguchi ................. 257/94

FOREIGN PATENT DOCUMENTS

| JP | 6-112561 | 4/1994 |
|---|---|---|
| JP | 7-245588 | 9/1995 |
| JP | 7-273398 | 10/1995 |
| JP | 9-97938 | 4/1997 |
| JP | 9-198696 | 7/1997 |
| JP | 9-265650 | 10/1997 |

(Continued)

OTHER PUBLICATIONS

Raghu Ranganathan et al., *Low penalty and error-floor free-performance for directly modulated 1.5-μm AlInGaAs/InP complex-coupled distributed feedback lasers in long-haul 2.5-Gbit/s systems*. OFC '98 Technical Digest, 242-243 (1998).

(Continued)

*Primary Examiner*—Armando Rodriguez
(74) *Attorney, Agent, or Firm*—Morrison & Foerster LLP

(57) ABSTRACT

A drive current is generated by mixing a pulse signal from a pulse generator and a DC current from a DC current power supply using a T circuit and injected into a nitride semiconductor laser having a horizontal light-confinement ridge structure. The horizontal light-confinement coefficient of the nitride semiconductor laser is between 85% and 99%. The time when the current waveform of the drive current is continuously over the threshold current of the nitride semiconductor laser ranges from 5 nsec to 1,000 nsec.

22 Claims, 9 Drawing Sheets

FOREIGN PATENT DOCUMENTS

| | | |
|---|---|---|
| JP | 10-294529 | 11/1998 |
| JP | 11-103108 | 4/1999 |
| JP | 11-291548 | 10/1999 |
| JP | 2000-114646 | 4/2000 |
| JP | 2001-34986 | 2/2001 |
| JP | 2001-148539 | 5/2001 |
| JP | 2001-223434 | 8/2001 |
| JP | 2001-308460 | 11/2001 |

OTHER PUBLICATIONS

Petar Pepeljugoski et al., *Effect of bit-rate, bias, and threshold currents on the turn-on timing jitter in lasers modulated with uncoded and coded waveforms*. IEEE Photonics Technology Letters, vol. 8, No. 3, 461-463 (1996).

* cited by examiner

θ // [°]

θ // [°]

θ // [°]

NITRIDE SEMICONDUCTOR LASER DEVICE AND SEMICONDUCTOR OPTICAL DEVICE

TECHNICAL FIELD

The present invention relates to a semiconductor laser device that is provided with a nitride semiconductor laser element employing a nitride semiconductor emitting blue light and that drives that nitride semiconductor laser element at an output as high as 20 to 35 [mW] on a time average basis. The present invention also relates to a semiconductor optical device, such as an optical information recording/reproducing device, that incorporates such a semiconductor laser device.

BACKGROUND ART

In recent years, there have been produced prototypes of nitride semiconductor laser elements that employ a nitride semiconductor material as exemplified by GaN, InN, AlN, and mixed crystal semiconductors of such materials and that emit light in a blue to ultraviolet region, and there has been paid much attention to, as next-generation high-density information recording/reproducing devices, optical information recording/reproducing devices that employ such a nitride semiconductor laser element as a light source. These optical information recording/reproducing devices adopt, as a method for recording information, for example, a method based on crystal phase change or a method based on magnetic phase transition.

These methods both use the energy of laser light as the heat source for a write operation, and thus, when used as such a light source, a nitride semiconductor laser element is required to operate at a high output. Moreover, for higher recording density, laser light needs to be focused into an extremely small spot, and the so focused small spot of laser light is required to remain in position during a write operation. Accordingly, a nitride semiconductor laser element used as a laser light source is required to oscillate in the fundamental lateral mode up to a high output.

For example, Collection of Lecture Manuscripts Prepared for the 47th Confederated Lecture Meeting for Applied Physics 31p-YQ-8 and an article by Shin-ichi Nagahama et al. contained in Japanese Journal of Applied Physics (Jpn. J. Appl. Phys.) Vol. 39 (2,000), pp. L647-L650, include reports on nitride semiconductor laser elements that oscillate in the fundamental lateral mode continuously up to an output of 30 to 40 [mW] at room temperature.

An example of such a conventional nitride semiconductor laser element is shown in FIG. 14. FIG. 14 is a sectional view schematically showing the structure of a principal portion of a nitride semiconductor laser element that oscillates at a wavelength of 410 [nm]. The nitride semiconductor laser element shown in FIG. 14 has the following layers formed one on top of another in the order mentioned on the surface of an n-type GaN substrate 171 (with a film thickness of 30 to 300 [μm]): an n-type $In_{0.05}Ga_{0.95}N$ buffer layer 172, an n-type $Al_{0.05}Ga_{0.95}N$ clad layer 173 (with a film thickness of 0.5 [μm]), an n-type GaN optical waveguide layer 174 (with a film thickness of 0.1 [μm]), an active layer 175 (with a film thickness of 360 [Å]), a p-type $Al_{0.2}Ga_{0.8}N$ layer 176 (with a film thickness of 200 [Å]), a p-type GaN optical waveguide layer 177 (with a film thickness of 0.1 [μm]), a p-type $Al_{0.05}Ga_{0.95}N$ clad layer 178 (with a film thickness of 0.5 [μm]), and a p-type GaN contact layer 179 (with a film thickness of 0.2 [μm]).

Here, the active layer 175 is composed of $In_{0.2}Ga_{0.8}N$ well layers each with a film thickness of 40 [Å] and n-type $In_{0.05}Ga_{0.95}N$ barrier layers each with a film thickness of 80 [Å], formed alternately one on top of another in three periods. Part of the p-type GaN contact layer 179 is masked, and then the p-type AlGaN clad layer 178 and the p-type GaN contact layer 179 are etched to form a ridge-shaped stripe with a width of 2 μm. This nitride semiconductor laser element has a waveguide structure in which the active layer 175 and the optical waveguide layers 174 and 177 are sandwiched between the clad layers 173 and 178. Thus, the light generated in the active layer 174 is confined in this waveguide structure to cause laser oscillation.

Substantially over the entire surface of the so etched region, there is formed an insulating film 180. Then, a positive electrode 181 is formed substantially over the entire surface of the insulating film 180, which includes the entire surface of the portion of the p-type GaN contact layer 179 that is exposed in the form of a surface. Moreover, a negative electrode 182 is formed substantially over the entire bottom surface of the n-type GaN substrate 171. Both end surfaces of the stripe function as mirrors, and thus form an optical cavity.

In a case where a nitride semiconductor laser element of this type is used as a light source that is indispensable to record and reproduce information to and from an optical disk, it is typically fed with a pulse current as its drive current. Specifically, for reproduction, an optical output of several [mW] suffices, but the return light noise needs to be minimized. One way to achieve this is to intentionally lower the use efficiency of laser light. This may reduce the amount of return light to a certain degree and thus help reduce the resulting noise below a permissible level. A more common way to reduce the return light noise, however, is to reduce the coherence of the nitride semiconductor laser element to make less likely the coupling of the return light with the light inside the laser. For this purpose, a nitride semiconductor laser element is commonly driven with a pulse current having a high frequency of 100 [MHz] superimposed thereon.

For recording also, typically, a pulse current train of which the pulse width has a peak level higher than the output during reproduction is modulated according to a signal. The purpose of using not a DC current but a pulse current here is as follows. If a DC current is modulated according to a signal, when the signal is long, over the duration thereof, i.e., from the beginning toward the end thereof, the temperature on an optical disk rises, with the result that the trace of recording on the disk is thin at the beginning but become increasingly thick toward the end. When information is reproduced from an optical disk having it recorded thereon in such a way, read errors are more likely.

As discussed above, a nitride semiconductor laser element used in an optical information recording/reproducing device is required to pulse-oscillate in the fundamental lateral mode up to an output as high as 20 to 35 [mW] on a time average basis. Accordingly, for example, in a case where it is driven with a pulse current with a duty factor of 30% (what a duty factor means will be described later), it is required to pulse-oscillate in the fundamental lateral mode up to a peak output of 60 to 100 [mW] within the pulse width duration.

However, when the inventors of the present invention produced 100 conventionally structured nitride semiconductor laser elements and drove them with a pulse current with a duty factor of 30%, it was confirmed that only less than 10 of them oscillated in the fundamental lateral mode at peak outputs of 0 [mW] to 60 [mW] within the pulse width duration, and that the rest oscillated in the high-order lateral modes in the above-mentioned range of outputs. This indicates that the yield rate of conventionally structured nitride semiconductor laser elements is 10% or less.

FIG. 12 shows an example of the peak output plotted against the peak current within the pulse width duration (hereinafter referred to simply as the "I-L characteristic") as observed in a conventional semiconductor laser element. The thin line in FIG. 12 indicates an example of a linear I-L characteristic of a nitride semiconductor laser element that operates in an ideal fashion; specifically, driving it with a pulse current with a duty factor of 30% results in an I-L characteristic that is linear up to a peak output of 90 mW within the constant current pulse width duration. As the peak level of the pulse current is increased, when the level becomes higher than a threshold level Ith, oscillation in the fundamental lateral mode starts, and as the peak level of the pulse current is further increased, the peak output linearly increases up to 90 [mW].

By contrast, the thick line indicates an example of the I-L characteristic of the aforementioned more than 90 nitride semiconductor laser elements produced by the inventors of the present invention. This I-L characteristic includes a kink, i.e., a non-linear portion. Specifically, as the peak level of the pulse current is increased, when the level becomes higher than the threshold level Ith, oscillation in the fundamental lateral mode starts, and as the peak level of the pulse current is further increased, when the level becomes higher than a kink current level Ik, a kink occurs.

In all of the aforementioned 90 nitride semiconductor laser elements in which a kink was observed, it was recognized that the horizontal far-field pattern (hereinafter referred to as the "FFP") changes before and after the point at which the kink was observed in the I-L characteristics. This proves that the cause of the kink is a change in the horizontal lateral mode. Now, with reference to FIG. 13, how the FFP changes against the peak level I of the pulse current will be described. It should be noted that, in FIG. 13, the horizontal FFP is shown as the light intensity distribution at different horizontal angles with respect to the direction in which laser light is emitted from a nitride semiconductor laser element.

FIG. 13(a) shows the horizontal FFP as obtained when a pulse current of which the peak level I fulfils Ith<I<Ik is injected to a nitride semiconductor laser element. Here, a light intensity distribution with a single peak is obtained. FIG. 13(b) shows an example of the horizontal FFP as obtained when a pulse current of which the peak level I fulfils I>Ik is injected. In this example, where the injected current has just exceeded the current level Ik, the horizontal FFP changes to a light intensity distribution with two peaks.

FIG. 13(c) shows another example of the horizontal FFP as obtained when a pulse current of which the peak level I fulfils I>Ik is injected. In this example, where the injected current has just exceeded the current level Ik, the position of the peak of the light intensity distribution of the horizontal far-field pattern is displaced. Here, the degree of the displacement is about 1 to 5 degrees relative to the position of the peak in FIG. 13(a).

In an AlGaAs-based semiconductor laser element, an asymmetric horizontal carrier distribution and an asymmetric horizontal light intensity distribution inside the stripe lead to unstable operation. Accordingly, a conventional way to ensure oscillation at a high output in the single lateral mode is to adopt an optical waveguide of the real refractive index type. An effective way to maintain the fundamental lateral mode up to a high output is to make the width of the optical waveguide narrow. However, making it too narrow results in weakening the horizontal confinement of the active layer (this can be explained by calculating the horizontal electric field distribution). Thus, there exists an optimum value for the stripe width.

In a nitride semiconductor laser element, the optimum stripe width is approximately proportional to the laser oscillation wavelength, and thus, in a nitride semiconductor laser element, the optimum stripe width is comparatively small, specifically about 2.0 [μm]. Moreover, the influence of an error from the optimum stripe width on the characteristics of the nitride semiconductor laser element becomes increasingly striking as the design value of the optimum stripe width is made smaller. In a nitride semiconductor laser element, to sufficiently reduce the influence of such an error on its characteristics, it is necessary to form the stripe so that its actual width is within ±0.1 [μm] of the optimum stripe width, and therefore it is extremely difficult to form it.

Furthermore, in a nitride semiconductor laser element, it is difficult to make flat the end surfaces through which laser light exits therefrom. The most commonly used material of the substrate used in a nitride semiconductor laser element is sapphire. When a multiple-layered structure formed of nitride semiconductor materials is epitaxially grown on top of this sapphire substrate, it grows in such a way that the cleavage plane of the sapphire substrate forms an angle of precisely 30 degrees to the cleavage plane of the nitride semiconductors. That is, the cleavage surface of the sapphire substrate is not parallel to the cleavage surface of the multiple-layered structured formed of nitride semiconductor materials. This makes it extremely difficult to obtain flat cleavage end surfaces. This makes the refractive index at the end surfaces horizontally uneven, and makes the light intensity distribution within the stripe more likely to be horizontally asymmetric, making instability more likely.

Moreover, in a nitride semiconductor laser element, InGaN, which is commonly used as the material of the active layer, is liable to phase separation. If even a slight defect is present in the base material of the active layer, the defect acts as a seed to cause In to segregate to form a layer. This makes it difficult to form the active layer with uniform composition. This makes the carrier distribution and light intensity distribution within the stripe more likely to be horizontally asymmetric, making instability more likely.

Moreover, in a nitride semiconductor laser element, the effective mass of the carriers in the active laser is greater than in a laser element formed of another material such as an AlGaAs-based one. This makes the diffusion length of the carriers accordingly small, and thus tends to aggravate the horizontal asymmetry of the carrier distribution. This, as in the case described above, makes the carrier distribution within the stripe more likely to be horizontally asymmetric, making instability more likely.

For the reasons explained above, a nitride semiconductor laser element is more likely to cause a kink as indicated by the thick line in FIG. 12 at a low optical output than is a semiconductor laser employing another material such as an AlGaAs-based one. Accordingly, simply setting the stripe width at the optimum value is not sufficient for a nitride semiconductor laser element to maintain oscillation in the fundamental lateral mode up to a high output.

DISCLOSURE OF THE INVENTION

An object of the present invention is to provide, at an improved yield rate, a nitride semiconductor laser device that incorporates a nitride semiconductor laser element with a reduced kink in its I-L characteristic and that, when driven with a pulse current, oscillates in the fundamental lateral mode up to a peak output as high as 60 to 100 [mW].

To achieve the above object, according to the present invention, a nitride semiconductor laser device is provided with: a nitride semiconductor laser element having a horizontal light confinement ridge structure; and a current supply that supplies the nitride semiconductor laser element with a high-frequency drive current. Here, the current generated by the current supply has a waveform such that the duration for which the current continuously remains higher than the threshold current level of the nitride semiconductor laser element 1,000 nsec or lower.

BEST MODE FOR CARRYING OUT THE INVENTION

Figure 1:
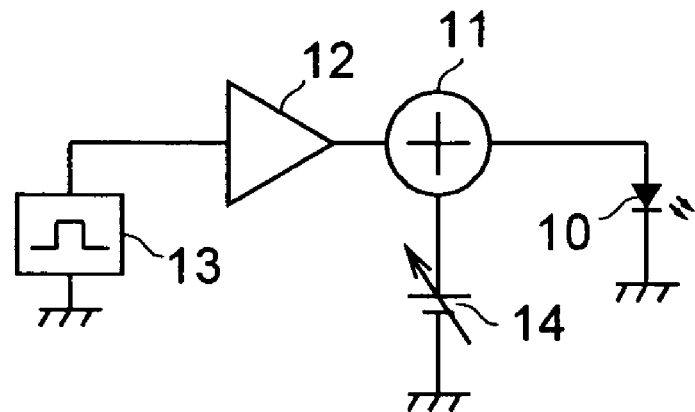
FIG. 1 is a block diagram showing an example of the internal configuration of a nitride semiconductor laser device according to the invention.

<Definitions of the Key Terms Used in the Present Specification>

In the present specification, a "nitride semiconductor laser element" denotes a nitride semiconductor laser element that employs as the material of an active layer a nitride semiconductor containing at least $Al_xIn_yGa_{1-x-y}N$ ($0 \leq x, y \leq 1$).

A "nitride semiconductor" usually denotes a hexagonally structured crystal of $Al_xIn_yGa_{1-x-y}N$. It is, however, also possible to use instead a hexagonally structured crystal in which part (about 20% or less) of its III group element is replaced with another element, such as B, Cr, V, Ti, Nb, Ta, Zr, Sc, Tl, Gd, or La, or a hexagonally structured crystal in which part of its N element (about 20% or less) is replaced with another element, such as P, As, or Sb. Moreover, the hexagonally structured crystal may include, in its multiple-layer structure, a layer of a different crystal material. Furthermore, the individual semiconductor layers may each have B, Al, In, Tl, P, As, Sb, Be, Mg, Cd, Zn, C, Si, Ge, Sn, O, S, Se, Te, H, Sc, Cu, Fe, Ti, V, Cr, Y, Zr, Nb, or a lanthanide element mixed thereto.

The "horizontal" direction is the direction perpendicular to the direction of the stripe length of a semiconductor laser element and parallel to the substrate surface of the semiconductor laser element.

The "horizontal mode confinement coefficient $\Gamma$" is a coefficient that is given, assuming that the horizontal light intensity distribution of a laser oscillation mode is I(y) and that the inside of the stripe width of the semiconductor laser element is represented as $|y| \leq W/2$, by the following formula (1):

$$\Gamma = \frac{\int_{-W/2}^{W/2} I(y)\,dy}{\int_{-\infty}^{+\infty} I(y)\,dy} \tag{1}$$

The equivalent refractive index and the horizontal light intensity distribution of a laser oscillation mode are calculated by the electric field distribution calculation and the equivalent refractive index method that are commonly used for a slab waveguide. For explanations of these methods, reference should be made to, for example, an article by M. J. Bergmann and H. C. Casey, Jr. contained in Journal of Applied Physics (J. Appl. Phys.) Vol. 84 (1998), pp. 1196-1203.

As a parameter used in electric field distribution calculation, the refractive index n of each material at the oscillation wavelength λ [nm] is calculated in the following manner. The oscillation wavelength λ is, for example, in the range of 300 to 800 [nm].

First, the energy gap Eg [eV] of each material is given by one of the following formulae, where Eg1[s] and Eg2[t] are functions:

For $In_sGa_{1-s}N$ ($0 \leq s \leq 1$), $Eg=Eg1[s]=3.42(1-s)+2.65s-3.94s(1-s);$ For $Al_tGa_{1-t}N$ ($0 \leq t \leq 1$), $Eg=Eg2[t]=3.42(1-t)+6.2t-1.057t(1-t);$ and For $In_sAl_tGa_{1-s-t}N$ ($0<s<1, 0<s<1$), $Eg=\{sEg1[s+t]+tEg2[s+t]\}/(s+t)$ By expressing $p[\lambda]=1/[1/\lambda-(Eg-3.42)/1239.852]$, the refractive index n is expressed by one of the following formulae, where $p[\lambda]$ is a function with respect to $\lambda$:

when $p[\lambda]>360.7$, $n(p[\lambda])=[4.3663801+p^2/(p^2-295.92^2)]^{0.5}$; and when $p[\lambda]\leq 360.7$, $n(p[\lambda])=c0+c1\times q+c2\times q^2+c3\times q^3+c4\times q^4$, where $q=p[\lambda]-360$
$c0=2.718$
$c1=9.976e-3$
$c2=3.005e-4$
$c3=4.584e-6$
$c4=2.596e-8$ In the present specification, the horizontal light intensity distribution of a laser oscillation mode is calculated, using the parameters defined above, by performing horizontal electric field distribution calculation in a slab waveguide once again inside the three-layer structure wherein a layer that has a refractive index corresponding to 0.002 added to the equivalent refractive index calculated from the vertical structure inside the stripe and that has a layer thickness corresponding to the stripe width is sandwiched between layers that have a refractive index equal to the equivalent refractive index calculated from the vertical structure outside the stripe.

FIRST EMBODIMENT

A first embodiment of the present invention will be described below with reference to the drawings. FIG. 1 is a block diagram showing an example of the configuration of a nitride semiconductor laser device according to the invention, and FIG. 2 is a diagram showing the time variation of the current injected to the nitride semiconductor laser element.

The nitride semiconductor laser device shown in FIG. 1 is provided with: a nitride semiconductor laser element 10 of which the cathode is grounded; a T circuit 11 for biasing which mixes together a high frequency with a DC current and of which the mixed signal output side is connected to the anode of the nitride semiconductor laser element 10; a high-frequency amplifier 12 of which the output side is connected to the high-frequency input side of the T circuit 11; a pulse generator 13 that feeds a pulse signal to the input side of the high-frequency amplifier 12; and a DC current source 14 for biasing which is connected to the input side of the T circuit 11.

In this configuration, the bias current supplied from the DC current source 14 and the pulse signal generated by the pulse generator 13 and amplified by the high-frequency amplifier 12 are mixed together by the T circuit 11 and are then fed to the nitride semiconductor laser element 10. As a result, the nitride semiconductor laser element 10 is fed with a current that varies with time as shown in FIG. 2.

Figure 2:
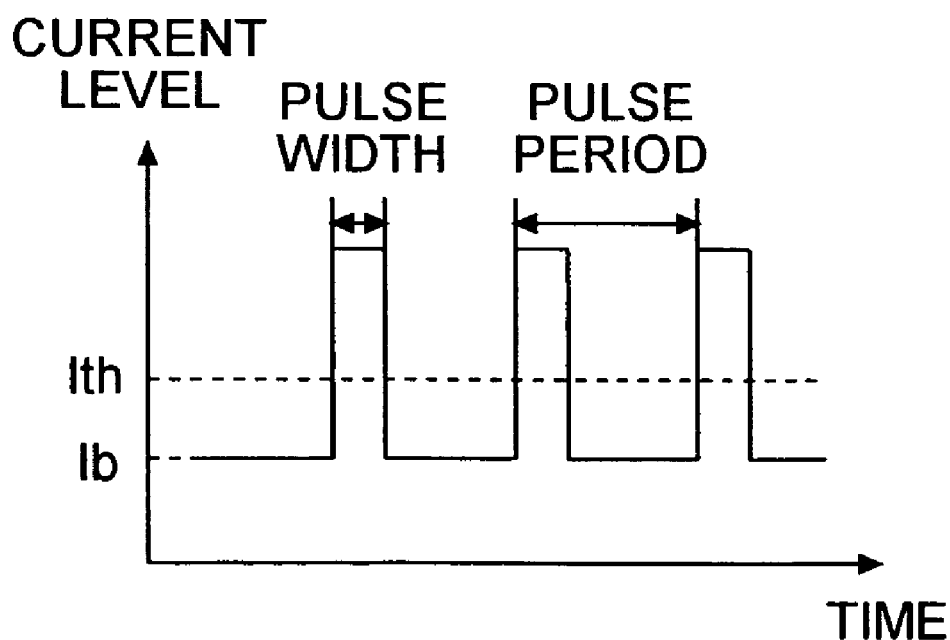
FIG. 2 is a diagram showing the time variation of the drive current supplied to the nitride semiconductor laser element provided in the nitride semiconductor laser device shown in FIG. 1.

Here, as shown in FIG. 2, the pulse generator 13 generates the pulse signal such that the duration (hereinafter referred to as the "pulse width") for which the current fed to the nitride semiconductor laser element 10 continuously remains higher than the threshold current Ith thereof is in the range from 5 [nsec] to 1,000 [nsec], both ends inclusive, and that the proportion (hereinafter referred to as the "duty factor") of the pulse width duration within the period (hereinafter referred to as the "pulse period") of the pulse waveform is in the range from 10% to 50%, both ends inclusive. Moreover, the current level Ib of the bias current fed from the DC current source 14 is set to be 80% or less of the threshold current Ith of the nitride semiconductor laser element.

Figure 3:
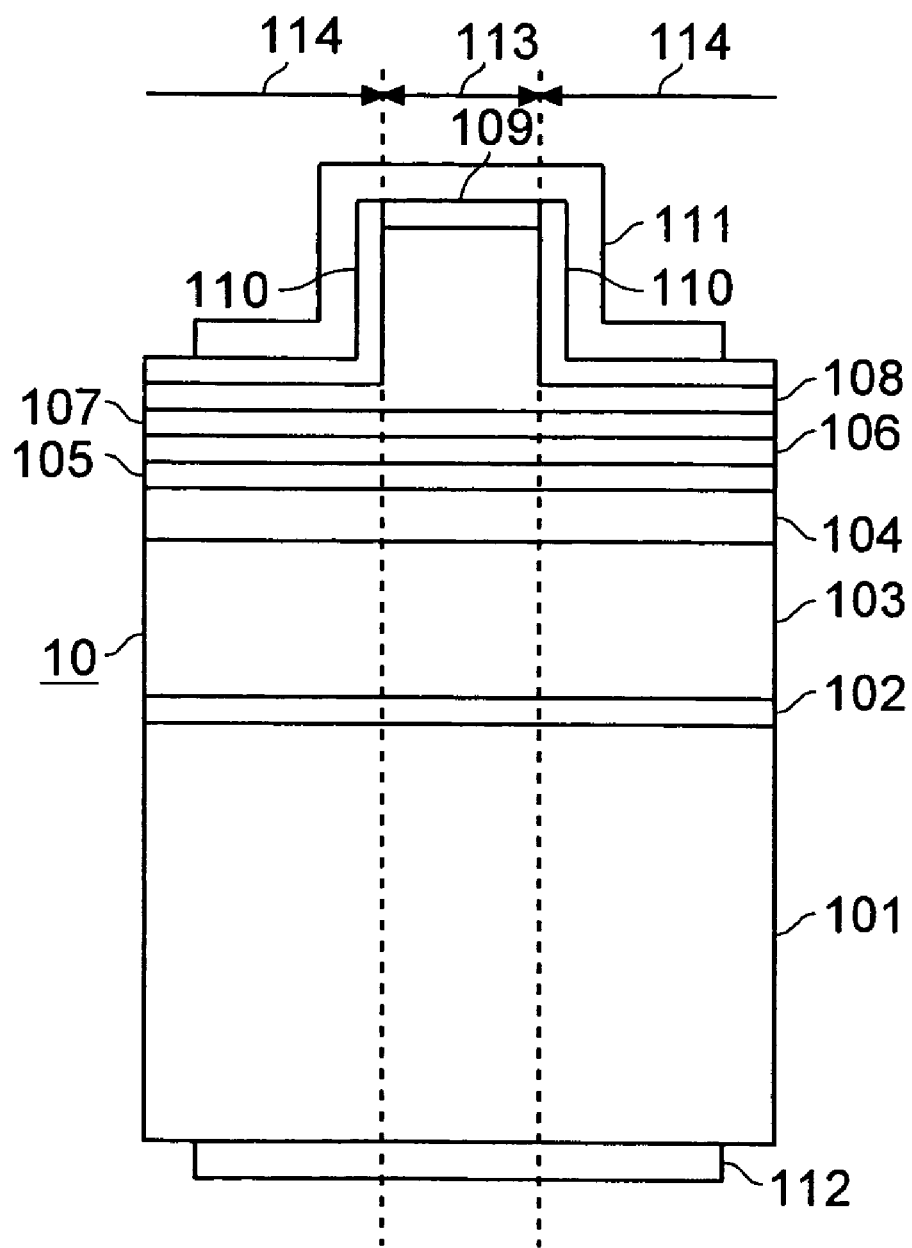
FIG. 3 is a sectional view showing an example of the structure of the nitride semiconductor laser element.

In the semiconductor laser device configured as described above, the nitride semiconductor laser element 10 is structured as described below. FIG. 3 is a sectional view showing an example of the structure of the nitride semiconductor laser element, taken along a plane perpendicular to the cavity of its waveguide portion.

The nitride semiconductor laser element 10 shown in FIG. 3 has the following nitride semiconductor layers formed one on top of another in the order mentioned on the surface of an n-type GaN substrate 101 (with a film thickness of 30 to 300 [μm]): a low-temperature buffer layer 102 (with a film thickness of 0 to 10 [μm]) formed of GaN; an n-type clad layer 103 (with a film thickness of 0.8 [μm] or more) formed of n-type $Al_xGa_{1-x}N$ ($0.05 \leq x \leq 0.2$); an n-type optical waveguide layer 104 (with a film thickness of 0 to 0.15 [μm]) formed of n-type GaN; an active layer 105 (oscillating at a wavelength of 370 to 430 nm, with a total film thickness of 5 to 60 [nm]) having a multiple quantum well structure composed of $In_wGa_{1-w}N$ ($v<w\leq 0.2$) well layers and n-type $In_vGa_{1-v}N$ ($0\leq v<w$) barrier layers formed alternately one on top of another; a p-type carrier block layer 106 (with a film thickness of 0 to 0.02 [μm]) formed of p-type $Al_zGa_{1-z}N$; a p-type optical waveguide layer 107 (with a film thickness of 0.05 to 0.15 [μm]) formed of p-type GaN; a p-type clad layer 108 (with a film thickness of 0.4 [μm] or more) formed of p-type $Al_yGa_{1-y}N$; and a p-type contact layer 109 (with a film thickness of 0.01 to 10 [μm]) formed of p-type GaN.

Part of the p-type contact layer 109 is masked, and then the p-type clad layer 108 and the p-type contact layer 109 are etched to form a ridge-shaped stripe. Substantially over the entire surface of the so etched region, there is formed an insulating film 110. Then, a positive electrode 111 is formed substantially over the entire surface of the insulating film 110, which includes the entire surface of the portion of the p-type contact layer 109 that is exposed in the form of a surface. Moreover, a negative electrode 112 is formed substantially over the entire bottom surface of the substrate 101. Both end surfaces of the stripe function as mirrors, and thus form an optical cavity.

The following layers form an inside-the-stripe vertical structure region 113: in order from the negative electrode 112 side, the substrate 101, low-temperature buffer layer 102, n-type clad layer 103, n-type optical waveguide layer 104, active layer 105, p-type carrier block layer 106, p-type optical waveguide layer 107, p-type clad layer 108, p-type contact layer 109, and positive electrode 111. On the other hand, the following layers form an outside-the-stripe vertical structure region 114: in order from the negative electrode 112 side, the substrate 101, low-temperature buffer layer 102, n-type clad layer 103, n-type optical waveguide layer 104, active layer 105, p-type carrier block layer 106, p-type optical waveguide layer 107, p-type clad layer 108, insulating film 110, and positive electrode 111.

Next, how this nitride semiconductor laser element 10 is manufactured will be described. First, the substrate 101 (with a film thickness of 100 to 500 [μm]), which is formed of n-type GaN having the (0001)C plane as the crystal growth plane, is cleaned. The cleaned GaN substrate 101 is brought into an MOCVD (metal organic chemical vapor phase deposition) machine so as to be cleaned at a high temperature of about 1,100° C. in an atmosphere of hydrogen ($H_2$).

Thereafter, the temperature is lowered, and, while $H_2$ is passed as a carrier gas at the rate of 10 [l/min], $SiH_4$ is introduced at the rate of 10 [nmol/min]. Then, at 600° C., NH$_3$ and trimethyl gallium (TMG) are introduced at the rates of 5 [l/min] and 20 [mol/min], respectively, to grow the low-temperature buffer layer 102 of n-type GaN with a thickness of 0 to 10 [μm] (for example, 100 [μm]).

This is how the low-temperature buffer layer 102 of n-type GaN is formed. It is, however, also possible to use, instead of n-type GaN, GaN with SiH$_4$ introduced at the rate of 0 [mol/min], or a film containing at least AlGaInN containing Al and In. In a case where Al is contained, an appropriate amount of trimethyl aluminum (TMA) is introduced at the time of film formation; in a case where In is contained, an appropriate amount of trimethyl indium (TMI) is introduced at the time of film formation.

Next, while N$_2$ and NH$_3$ are passed at the rate of 5 [l/min] each, the supply of TMI, TMG, and SiH$_4$ is stopped. Then, the temperature is raised back to 1,050° C., and the flow rate of TIG is adjusted to 50 [μmol/min], and a predetermined amount of TMA is introduced to grow, while SiH$_4$ is passed at the rate of 10 [nmol/min], the n-type clad layer 103 of n-type Al$_x$Ga$_{1-x}$N (for example, x=0.1) with a thickness of 0.8 [μm] or more (for example 1 [μm]).

On completion of the growth of the n-type clad layer 103, the supply of TMA is stopped, and the flow rate of TMG is adjusted to 100 [μmol/min] to grow the n-type optical waveguide layer 104 with a thickness of 0 to 0.15 [μm] (for example 0.10 [μm]). The n-type optical waveguide layer 104 may be formed as a non-doped optical waveguide layer.

Thereafter, the supply of TMG is stopped, the carrier gas is changed from H$_2$ back to N$_2$, the temperature is lowered to 700° C., and, as a raw material of indium, a predetermined amount of trimethyl indium (TMI) is introduced along with TMG introduced at the rate of 15 [μmol/min] to grow a barrier layer of In$_v$Ga$_{1-v}$N (for example, v=0.023). Thereafter, the supply of TMI is increased to a predetermined amount to grow a well layer of In$_w$Ga$_{1-w}$N (for example, w=0.070). Then, in the same manners, InGaN barrier layers and InGaN well layers are grown alternately to grow the active layer 105 having a multiple quantum well structure (barrier layer/well layer/ . . . /well layer/barrier layer) composed of a plurality of well layers and barrier layers formed alternately one on top of another.

The crystal mix ratio and film thickness of the InGaN of which the barrier layers and well layers are formed are so designed that light is emitted at a wavelength in the range from 370 to 430 [μm], and the flow rate of TMI that is introduced at the time of growth is so adjusted that the In composition exactly as so designed is obtained. In the active layer 105, the number of well layers is preferably 2 to 6, and more preferably 2 to 3. Either the well layers or barrier layers or both may be a non-doped semiconductor or an n-type semiconductor doped with, for example, Si.

On completion of the growth of the active layer 105, the supply of TMI and TMG is stopped, the temperature is raised back to 1,050° C., and the carrier gas is changed from N$_2$ back to H$_2$. Then, TMG is passed at the rate of 50 [μmol/min] along with an appropriate amount of TMA as well as, as a raw material of a p-type dopant, biscyclopentadienyl magnesium (Cp$_2$Mg) passed at the rate of 10 [nmol/min] to grow the p-type carrier block layer 106 of p-Al$_z$Ga$_{1-z}$N (for example, z=0.2) with a thickness of 0 to 20 [μm], which serves as an evaporation prevention layer. The p-type carrier block layer 106 may be formed as a non-doped carrier block layer.

On completion of the growth of the p-type carrier block layer 106, the supply of TMA is stopped, and the amount of TMG supplied is adjusted to 100 [μmol/min] to grow the p-type optical waveguide layer 107 of p-type GaN with a thickness of 0.05 to 0.15 [μelm] (for example, 0.1 [μm]). This p-type optical waveguide layer 107 may be formed as a non-doped optical waveguide layer.

Thereafter, the supply of TMG is adjusted to 50 [μmol/min], and a predetermined amount of TMA is introduced to grow the p-type clad layer 108 of p-type Al$_y$Ga$_{1-y}$N (for example, y=0.20) with a thickness of 0.4 [μm] or more (for example 0.5 [μm]). Lastly, the supply of TMG is adjusted to 100 [μmol/min], and the supply of TMA is stopped to grow the p-type contact layer 109 of p-type GaN with a thickness of 0.01 to 10 [μm] (for example, 0.1 [μm]). This is the end of the growth of the light-emitting element structure. On completion of the growth thereof, the supply of TMG and Cp$_2$Mg is stopped, and the temperature is lowered to room temperature. Then, the wafer having nitride semiconductor layers formed on the substrate 101 as described above is taken out of the MOCVD machine.

Thereafter, by photolithography and reactive ion etching, etching is performed to a depth that reaches into the p-type clad layer 108 in such a way that part of the p-type contact layer 109 is left in the form of a stripe with a width of 1 to 4 [μm] (for example, 2 [μm]) in order to form a stripe that constitutes an optical waveguide. Here, the film thickness of the p-type clad layer 108 in the so etched region is so adjusted that the full angle at half maximum Θ of the horizontal FFP is in the range from 6 to 10 degrees (for example, 8 degrees). It should be noted that the full angle at half maximum Θ denotes the angle that subtends the range within which the horizontal FFP of the optical output has half its peak value or higher. Thereafter, by photolithography, the insulating film 110 is formed all over on top except where the p-type contact layer 109 makes contact with the positive electrode 111.

Then, the positive electrode 111 is formed substantially over the entire surface of the p-type contact layer 109. The material of this electrode is, for example, Au/Ni or Au/Pd. On the other hand, the negative electrode 112 is formed substantially over the entire bottom surface of the substrate 101. The material of this electrode is, for example, Al/Ti or Au/W. The wafer having nitride semiconductor layers formed on the substrate 101 as described above is then cleaved to produce end surfaces that function as cavity mirrors, and this is the completion of the manufacture of the nitride semiconductor laser element 10 shown in FIG. 3.

Figure 4:
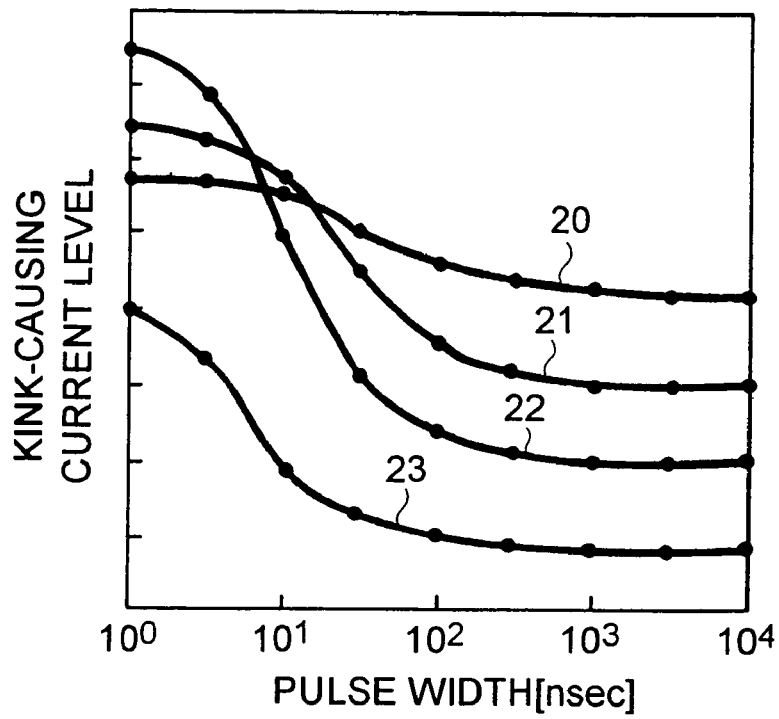
FIG. 4 is a diagram showing the relationship between the pulse width of the pulse current fed to the nitride semiconductor laser element and the current level Ik at which a kink occurs in the I-L characteristic.

FIG. 4 is a diagram showing the relationship between the pulse width of the drive current fed to the nitride semiconductor laser element 10 and the kink current level Ik at which a kink occurs in the I-L characteristic, and the curves 20 to 23 therein indicate the characteristics of nitride semiconductor laser elements with different horizontal mode confinement coefficients Γ. Specifically, the curves 20, 21, 22, and 23 deal with cases in which the horizontal mode confinement coefficients Γ are 0.85, 0.90, 0.95, and 0.99, respectively. FIG. 4 indicates that, for all the curves 20 to 23, as the pulse width decreases, the kink current level Ik increases.

One commonly recognized cause of the change of the fundamental lateral mode resulting from injection of a current is instability of the horizontal carrier distribution inside the stripe. If this is the case, the change of the mode is considered to be suppressed by driving the laser with pulses of which the pulse width is several [nsec] or less, i.e., shorter than is required for the carrier distribution to move. In the structure of this embodiment, however, the change of the mode is suppressed with a pulse width of 1,000 [nsec] or less, i.e., a pulse width of an utterly different order from the one mentioned above. Accordingly, here, the change of the mode is not considered to result from instability of the horizontal carrier distribution inside the stripe.

Specifically, in an AlGaAs-based semiconductor laser element and in a conventional nitride semiconductor laser element, the photon density is higher inside the stripe than outside the stripe. In the first place, the carrier density is higher inside the stripe than outside the stripe, and, as the difference between the photon densities inside and outside the stripe grows greater, the degree of reduction of the carrier density resulting from induced ejection inside the stripe becomes higher than the degree of reduction of the carrier density outside the stripe.

Since the carrier density is inversely proportional to the refractive index, the degree of reduction of the refractive index inside the stripe is lower than the degree of reduction of the refractive index outside the stripe. Thus, conventionally, as the optical output of a semiconductor laser element increases, the difference between the refractive indices inside and outside the stripe becomes smaller. This inhibits the real refractive index waveguide from functioning as designed, resulting in instability of the horizontal lateral mode.

By contrast, in the nitride semiconductor laser device according to the invention, within the active layer 105 of the nitride semiconductor laser element 10, the injected current density is higher inside the stripe than outside the stripe, and thus the temperature is higher inside the stripe than outside the stripe. This difference between the temperatures inside and outside the stripe within the active layer 105 becomes increasingly striking as the pulse width decreases. The higher the temperature, the higher the refractive index of the nitride semiconductor material.

As a result, the degree of the increase of the refractive index resulting from a rise in the temperature inside the stripe is higher than outside the stripe. This cancels out the tendency of the refractive index becoming lower as the carrier density becomes higher. That is, by reducing the pulse width, it is possible to bring the difference between the refractive indices of the active layer 105 inside and outside the stripe back to its designed value. This makes instability less likely even with a high current level and thus with high light intensity, and thus makes the kink current level Ik higher.

Moreover, reducing the pulse width to bring the difference between the refractive indices of the active layer 105 inside and outside the stripe back to its designed value also serves to make more even and symmetric the refractive index inside the stripe by correcting the unevenness and asymmetry thereof resulting from the unevenness and asymmetry of the injected current density inside the stripe.

A nitride semiconductor laser element 10 is said to suffer from more defects in the active layer 105 than a laser element formed of another material, such as an AlGaAs-based semiconductor laser element. As a result, when a current is injected to the active layer 105, the proportion of dark recombination is higher than in a semiconductor laser element formed of another material, and thus the generation of temperature is more striking. That is, the effects brought about by the present invention are believed to be more striking than in a semiconductor laser element formed of another material.

The purpose of setting the bias current supplied from the DC current source 14 equal to or lower than the threshold current level Ith of the nitride semiconductor laser element 10 is to prevent, in practical application, the threshold current level Ith from rising as the temperature of the nitride semiconductor laser element 10 rises.

FIG. 4 also indicates that the increase of the kink current level Ik is striking when the pulse width is 1,000 [nsec] or less, and is more striking as the pulse width becomes shorter. However, if the pulse width is too short, when the nitride semiconductor laser element 10 is used as a light source for recording to an optical disk, it is not possible to obtain the power necessary for recording. Thus, the pulse width needs to be 5 [nsec] or more. Accordingly, to obtain the effects of the present invention, the pulse width needs to be in the range from 5 [nsec] to 1,000 [nsec], and preferably in the range from 10 [nsec] to 100 [nsec].

If the horizontal mode confinement coefficient $\Gamma$ of the nitride semiconductor laser element 10 is greater than 0.99, the kink current level Ik no longer increases strikingly even as the pulse width reduces within the range from 5 [nsec] to 1,000 [nsec]. This is because, as the horizontal mode confinement coefficient $\Gamma$ becomes greater than 0.99, the horizontal high-order lateral modes are likely to occur, suppressing the increase of the kink current level Ik. For this reason, the horizontal mode confinement coefficient $\Gamma$ needs to be 0.99 or smaller.

On the other hand, if the horizontal mode confinement coefficient $\Gamma$ is smaller than 0.85, the increase of the current level necessary for laser oscillation is striking; that is, the increase of the threshold current level Ith is striking. This increases the electric power required for operation. Moreover, if the horizontal mode confinement coefficient $\Gamma$ is too small, it is more difficult to confine light inside the stripe, and thus light is more likely to leak out of the stripe, diminishing the effects of the present invention.

Accordingly, to obtain the effects of the present invention, the horizontal mode confinement coefficient $\Gamma$ of the nitride semiconductor laser element 10 needs to be in the range from 0.85 to 0.99, preferably in the range from 0.85 to 0.95, and more preferably in the range from 0.88 to 0.92.

Figure 5:
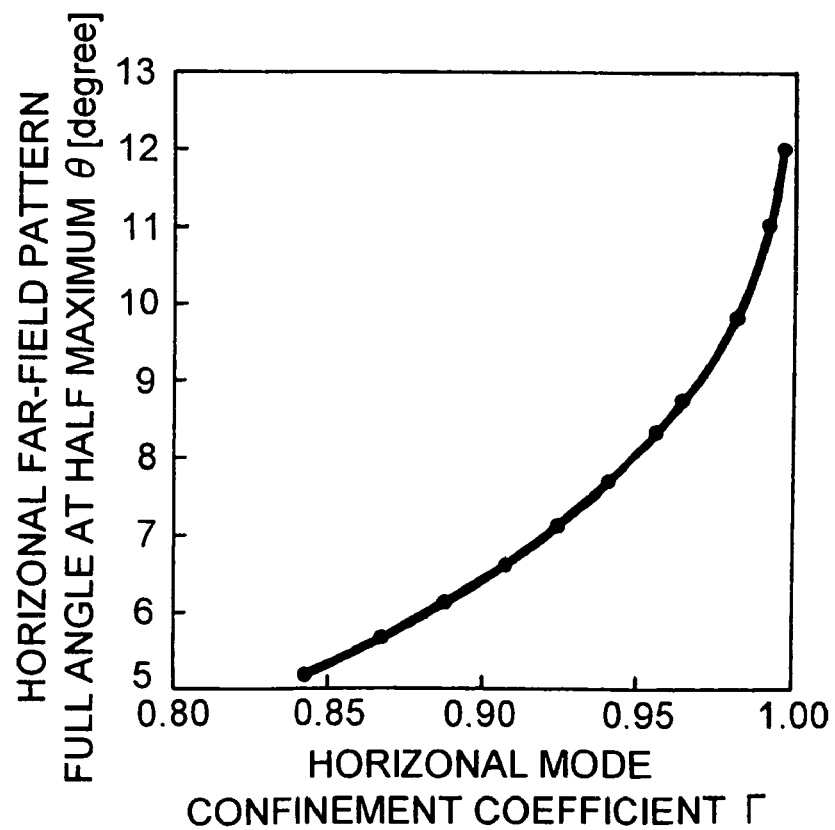
FIG. 5 is a diagram showing the relationship between the horizontal mode confinement coefficient $\Gamma$ of the fundamental lateral mode in the nitride semiconductor laser element and the full angle at half maximum $\Theta$ of the horizontal FFP in the nitride semiconductor laser element.

FIG. 5 is a graph showing the relationship between the horizontal mode confinement coefficient $\Gamma$ of the fundamental lateral mode and the full angle at half maximum $\Theta$ of the horizontal FFP in the nitride semiconductor laser element 10. As shown in FIG. 5, the horizontal mode confinement coefficient $\Gamma$ and the full angle at half maximum $\Theta$ of the horizontal FFP have a one-to-one relationship with each other. In a nitride semiconductor laser element of the real refractive index waveguide type, this relationship remains identical even when the various structural parameters and the oscillation wavelength are varied.

When the full angle at half maximum $\Theta$ of the horizontal FFP is in the range from 5 degrees to 11 degrees, the horizontal mode confinement coefficient $\Gamma$ is in the range from 0.85 to 0.99. That is, to obtain the effects of the present invention, the full angle at half maximum $\Theta$ of the horizontal FFP needs to be in that range.

Figure 6:
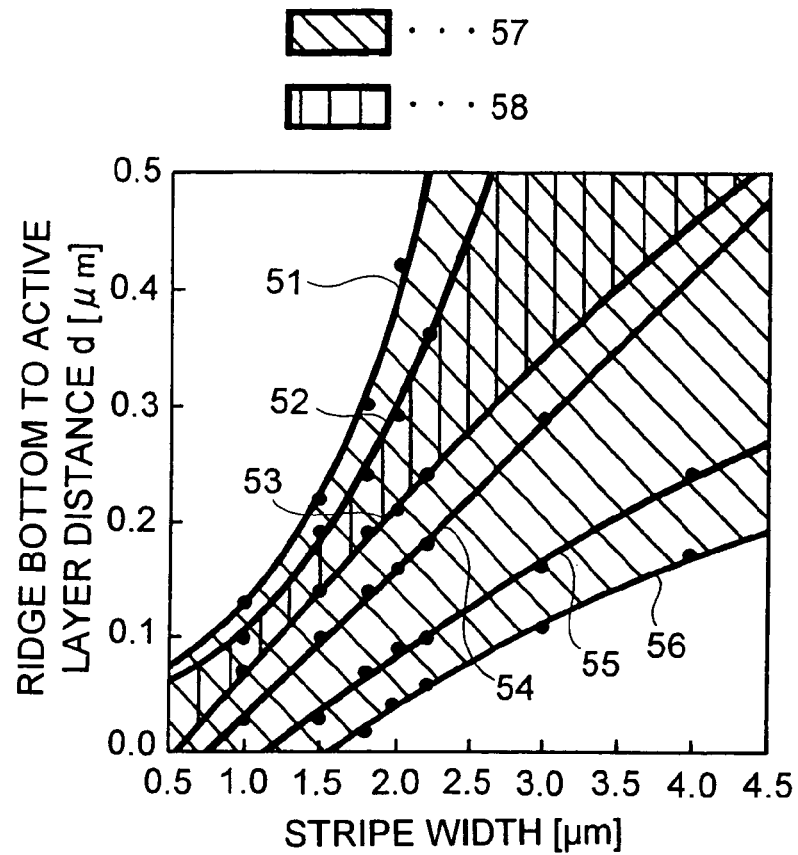
FIG. 6 is a diagram showing the relationship between the stripe width W [μm] and the clad layer remain film thickness d [μm] as required for the horizontal mode confinement coefficient $\Gamma$ of the fundamental lateral mode to remain constant in the nitride semiconductor laser element.

FIG. 6 is a graph showing the relationship between the stripe width W [μm] and the distance d [μm] from the ridge bottom surface of the clad layer 108 to the active layer 105, as required for the horizontal mode confinement coefficient $\Gamma$ of the fundamental lateral mode to remain constant in the nitride semiconductor laser element 10. The curves 51, 52, 53, 54, 55, and 56 shown therein deal with cases where the horizontal mode confinement coefficient $\Gamma$ equals 0.85, 0.88, 0.92, 0.95, 0.98, and 0.99, respectively.

The region in which the horizontal mode confinement coefficient $\Gamma$ is in the range from 0.85 to 0.99 corresponds to the region 57 shown in FIG. 6. Thus, in the nitride semiconductor laser element 10 of this embodiment, to obtain the effects of the present invention, the values of d and W need to be set within the range of the region 57. More preferably, the values of d and W are set in the range corresponding to the region 58 shown in FIG. 6, which corresponds to the region in which the horizontal mode confinement coefficient Γ is in the range from 0.88 to 0.92.

Specifically, in FIG. 6, the curve 51 is approximated by formula (2) below in the range of $0.5 \leq W \leq 4.0$ and $0 \leq d \leq 0.5$; the curve 52 is approximated by formula (3) below in the range of $0.5 \leq W \leq 4.0$; the curve 53 is approximated by formula (4) below in the range of $0.5 \leq W \leq 4.0$; the curve 54 is approximated by formula (5) below in the range of $0.5 \leq W \leq 4.0$; the curve 55 is approximated by formula (6) below in the range of $0.5 \leq W \leq 4.0$; and the curve 56 is approximated by formula (7) below in the range of $0.5 \leq W \leq 4.0$:

$$d = 0.040665 \times \exp(1.1403 \times W) \quad (2)$$

$$d = 0.059863 + W \times (-0.033606) + W^2 \times 0.076082 \quad (3)$$

$$d = -0.087482 + W \times 0.16383 + W^2 \times (-0.0068603) \quad (4)$$

$$d = -0.097173 + W \times 0.12998 + W^2 \times (-0.00047994) \quad (5)$$

$$d = -0.11845 + W \times 0.11236 + W^2 \times (-0.0058114) \quad (6)$$

$$d = -0.15783 + W \times 0.11555 + W^2 \times (-0.0084423) \quad (7)$$

Hence, the regions 57 and 58 fulfill formulae (8) and (9) below, respectively:

$$-0.15783 + W \times 0.11555 + W^2 \times (-0.0084423)$$
$$\leq d \leq 0.040665 \times \exp(1.1403 \times W),$$

$$0.5 \leq W \leq 4.0, \text{ and}$$

$$0 \leq d \leq 0.5 \quad (8)$$

$$-0.087482 + W \times 0.16383 + W^2 \times (-0.0068603)$$
$$\leq d \leq 0.059863 + W \times (-0.033606) + W^2 \times 0.076082,$$

$$0.5 \leq W \leq 4.0, \text{ and}$$

$$0 \leq d \leq 0.5 \quad (8)$$

Accordingly, in the nitride semiconductor laser element 10 of this embodiment, to obtain the effects of the present invention, it is necessary that the relationship between the stripe width W [μm] and the distance d [μm] from the ridge bottom surface of the clad layer 108 to the active layer 105 fulfill formula (8), and preferably formula (9).

Figure 7:
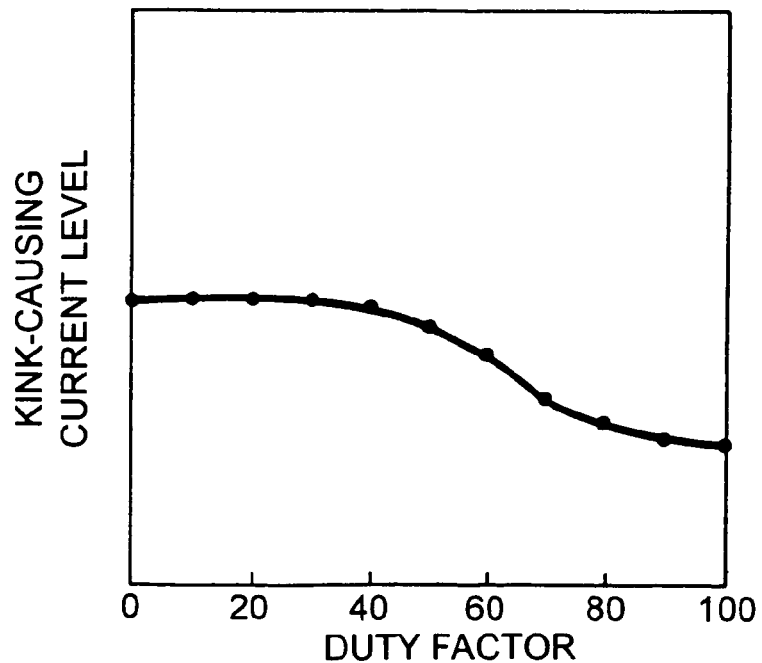
FIG. 7 is a diagram showing the relationship between the duty factor of the pulse waveform fed to the nitride semiconductor laser element and the current level Ik at which a kink occurs in the I-L characteristic.

FIG. 7 is a graph showing the relationship between the duty factor of the pulse waveform fed to the nitride semiconductor laser element 10 and the kink current level Ik at which a kink occurs in the I-L characteristic. Here, the pulse width is kept constant at 30 [nsec], and the duty factor is varied by varying the pulse period.

The curve shown in FIG. 7 indicates that, as the duty factor increases above 60%, the kink current level Ik gradually decreases, and that, as the duty factor approaches 100%, the kink current level Ik approaches that observed when the pulse width is 1,000 [nsec] or more in FIG. 2. This relationship remains identical when the pulse width is varied within the range from 5 [nsec] to 1,000 [nsec]. This is believed to be due to the fact that, as the duty factor approaches 100%, the difference between the temperatures of the active layer 105 inside and outside the stripe becomes small.

Accordingly, to fully obtain the effects of the present invention, it is preferable that the duty factor be set to be 60% or less. If the duty factor is too low, however, when the nitride semiconductor laser element 10 is used as a light source for recording to an optical disk, it is impossible to obtain the optical output required for recording. Thus, it is preferable that the duty factor be set to be 10% or more. It is more preferable that the duty factor be set to be in the range from 30% to 50%.

It is preferable that the bias current level Ib of the DC current source 14 for biasing be set to be 80% or less of the threshold current level Ith of the nitride semiconductor laser element 10. If the bias current level Ib is higher than 80% of the threshold current level Ith, when the current is injected, in the nitride semiconductor laser element 10, the difference between the temperature of the portion of the active layer 105 included in the inside-the-stripe vertical structure region 113 and the temperature of the portion of the active layer 105 included in the outside-the-stripe vertical structure region 114 becomes smaller, diminishing the effects of the present invention. This reduces the kink current level Ik. Thus, it is preferable that the bias current level Ib be low. However, an excessively large difference between the peak current within the pulse width and the bias current level Ib is undesirable from the perspective of the circuit design of the pulse generator 13. Accordingly, it is more preferable that the bias current level Ib be set to be in the range of about 50% to about 70% of the threshold current level Ith.

Figure 12:
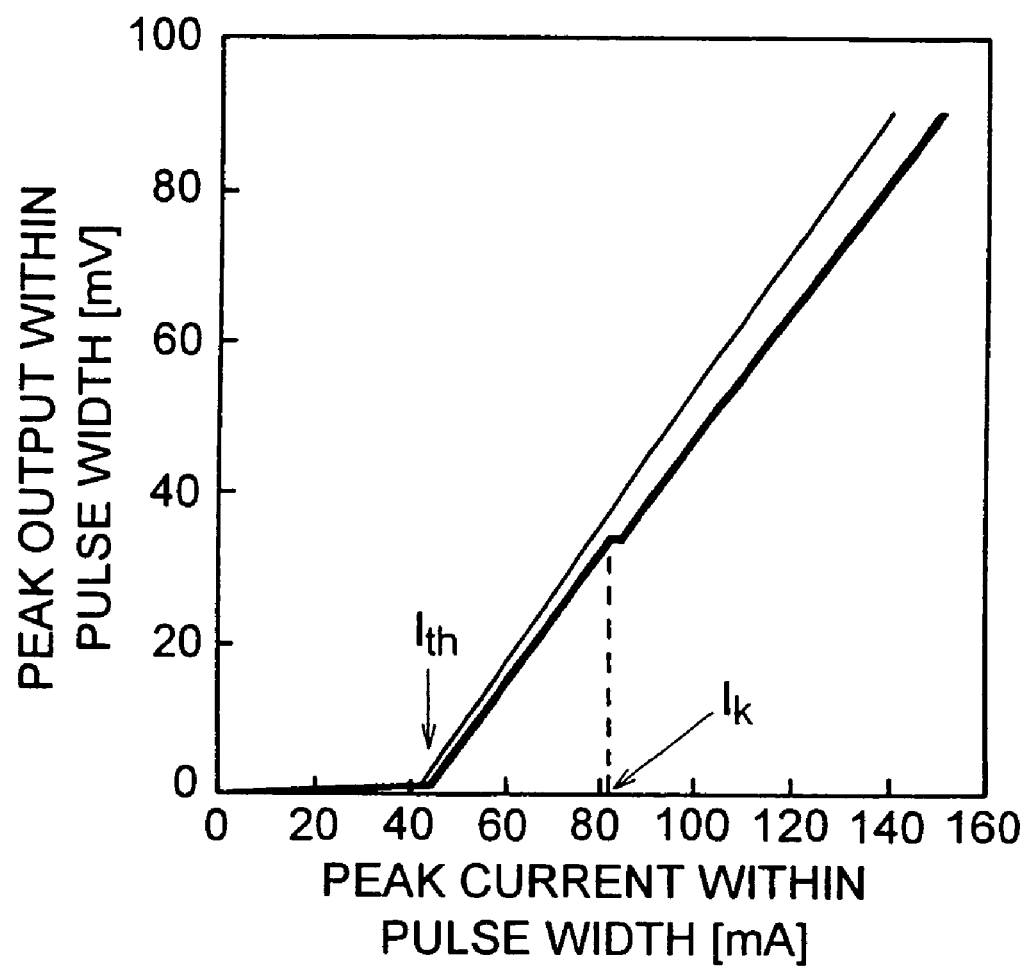
FIG. 12 is a diagram showing the I-L characteristic of a conventional nitride semiconductor laser element.
Figure 13A:
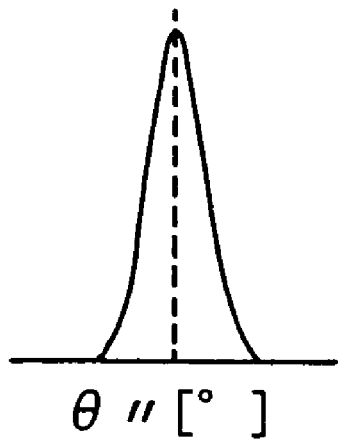
FIG. 13 is a diagram illustrating how the far-field pattern changes.
Figure 13B:
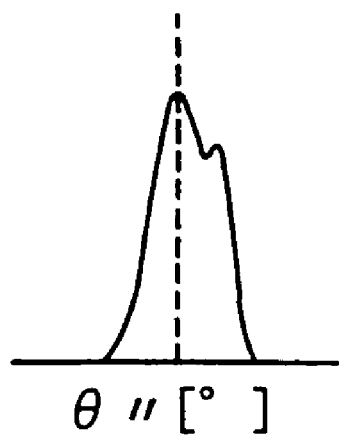
Figure 13C:
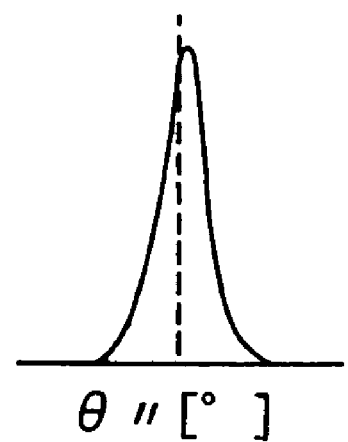
Figure 14:
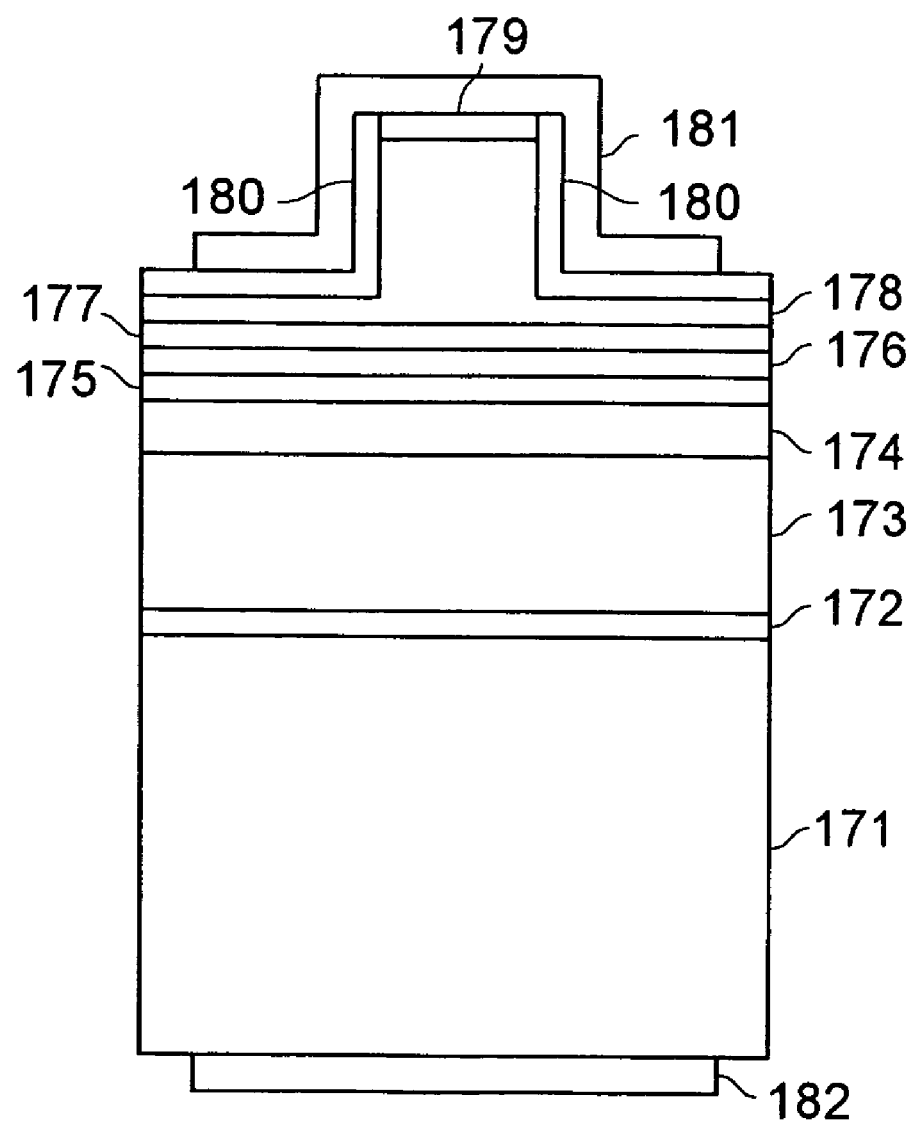
FIG. 14 is a sectional view showing an example of the structure of a conventional nitride semiconductor laser element.

In the nitride semiconductor laser device of this embodiment, laser oscillation occurred at a threshold current density of 1.2 [kA/cm$^2$], with a full angle at half maximum Θ of 8.2 degrees. The I-L characteristic of the nitride semiconductor laser element 10 had the same tendency as the thin line shown in FIG. 12, and, among 100 samples actually produced, about 90 maintained the fundamental lateral mode at peak outputs from 0 [mW] up to 100 [μW] within the pulse width, realizing a greatly improved yield rate as compared with conventional nitride semiconductor laser devices.

SECOND EMBODIMENT

Figure 8:
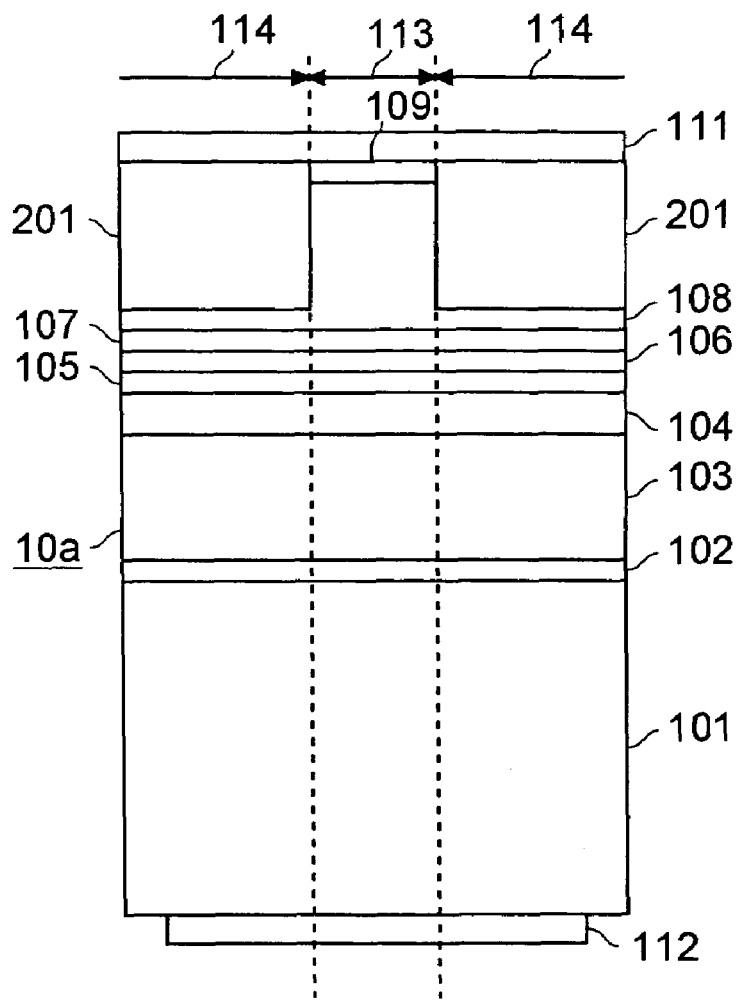
FIG. 8 is a sectional view showing an example of the structure of the nitride semiconductor laser element.

A second embodiment of the present invention will be described below with reference to the drawings. In this embodiment, a nitride semiconductor laser device having the same configuration as the one used in the first embodiment and shown in FIG. 1 is used. FIG. 8 is a sectional view showing another example of the structure of the nitride semiconductor laser element provided in the nitride semiconductor laser device of this embodiment, taken along a plane perpendicular to the cavity of its waveguide portion. In this nitride semiconductor laser element shown in FIG. 8, such structural portions as are found also in the nitride semiconductor laser element shown in FIG. 3 are identified with the same reference numerals, and their detailed explanations will not be repeated.

The nitride semiconductor laser element 10a shown in FIG. 8, like the nitride semiconductor laser element 10 of the first embodiment (FIG. 3), has the following nitride semiconductor layers formed one on top of another in the order mentioned on the surface of an n-type GaN substrate 101: a low-temperature buffer layer 102, an n-type clad layer 103, an n-type optical waveguide layer 104, an active layer 105, a p-type carrier block layer 106, a p-type optical waveguide layer 107, a p-type clad layer 108, and a p-type contact layer 109.

Then, part of the p-type contact layer 109 is masked, and the p-type clad layer 108 and the p-type contact layer 109 are etched so as to form a ridge-shaped stripe that constitutes a waveguide portion. Then, substantially over the entire surface of the so etched region, there is formed a buried layer 201 of n-type $Al_{y1}Ga_{1-y1}N$ ($y \leq y1 \leq 1$). Then, a positive electrode 111 is formed substantially over the entire surface of the buried layer 201, which includes the entire surface of the portion of the p-type contact layer 109 that is exposed in the form of a surface. Moreover, a negative electrode 112 is formed substantially over the entire bottom surface of the substrate 101. Both end surfaces of the stripe function as mirrors, and thus form an optical cavity.

The following layers form an inside-the-stripe vertical structure region 113: in order from the negative electrode 112 side, the substrate 101, low-temperature buffer layer 102, n-type clad layer 103, n-type optical waveguide layer 104, active layer 105, p-type carrier block layer 106, p-type optical waveguide layer 107, p-type clad layer 108, p-type contact layer 109, and positive electrode 111. On the other hand, the following layers form an outside-the-stripe vertical structure region 114: in order from the negative electrode 112 side, the substrate 101, low-temperature buffer layer 102, n-type clad layer 103, n-type optical waveguide layer 104, active layer 105, p-type carrier block layer 106, p-type optical waveguide layer 107, p-type clad layer 108, buried layer 201, and positive electrode 111.

This nitride semiconductor laser element 10a is manufactured in the same manner as the nitride semiconductor laser element 10 of the first embodiment up to the step of forming the p-type contact layer 109, except the step of forming the buried layer 201. Accordingly, for detailed explanations of the manufacturing process here, which will be omitted below, reference should be made to the description of the first embodiment.

After the formation of the p-type contact layer 109, by photolithography and wet etching, a stripe-shaped mask for forming an optical waveguide is formed on the p-type contact layer 109. Then, by reactive ion etching, etching is performed to a depth that reaches into the p-type clad layer 108 in such a way that part of the p-type contact layer 109 is left in the form of a stripe with a width of 1 to 4 [µm] (for example, 2 [µm]) in order to form a stripe that constitutes an optical waveguide.

Next, without removing the mask, the wafer is brought into the MOCVD machine again, and the temperature is raised to about 750 degrees. Then, while $H_2$ is passed as a carrier gass, the amount of TMG supplied is adjusted to 50 [µmol/min]. Here, while a predetermined amount of TMA is introduced, $SiH_4$ is passed at the rate of 10 [nmol/min] to form the buried layer 201 of n-type AlGaN (for example, y=0.3) over the entire surface of the etched region. Then, the supply of all the gases is stopped, the temperature is lowered to room temperature, and then the wafer is taken out of the MOCVD machine.

Thereafter, by wet etching, the mask is removed, and the positive electrode 111 is formed substantially over the entire surface of the p-type contact layer 109 and substantially over the entire surface of the buried layer 201. The material of this electrode is, for example, Au/Ni or Au/Pd. On the other hand, the negative electrode 112 is formed substantially over the entire bottom surface of the substrate 101. The material of this electrode is, for example, Al/Ti or Au/W. The wafer is then cleaved to produce end surfaces that function as cavity mirrors, and this is the completion of the manufacture of the nitride semiconductor laser element 10a shown in FIG. 8.

A semiconductor laser device provided with this nitride semiconductor laser element 10a is, as in the first embodiment, configured as shown in FIG. 1, and the nitride semiconductor laser element 10a is fed with a drive current similar to the one used in the first embodiment. Specifically, it is preferable that the pulse width be in the range from 5 [nsec] to 1,000 [nsec] (more preferably, in the range from 10 [nsec] to 100 [nsec]), that the duty factor be in the range from 10% to 60% (more preferably, in the range from 30% to 50%), and that the bias current level Ib be 80% or less of the threshold level Ith (more preferably, in the range from 50% to 70% of the threshold level Ith).

In this embodiment also, the nitride semiconductor laser element has a structure of the real refractive index waveguide type. Accordingly, when the horizontal mode confinement coefficient $\Gamma$ is in the range from 0.85 to 0.99 (more preferably, in the range from 0.88 to 0.92), or when the full angle at half maximum $\Theta$ of the horizontal FFP is in the range from 5 degrees to 11 degrees, or when the relationship between the stripe width W [µm] and the distance d [µm] from the ridge bottom surface of the clad layer 108 to the active layer 105 fulfills formula (8) (more preferably, formula (9)), the effects of the present invention can be obtained.

There exist various structures of the real refractive index waveguide type other than the one dealt with in this embodiment. With any of such structures, when the horizontal mode confinement coefficient $\Gamma$ is in the range from 0.85 to 0.99 (more preferably, in the range from 0.88 to 0.92), or when the full angle at half maximum $\Theta$ of the horizontal FFP is in the range from 5 degrees to 11 degrees, or when the relationship between the stripe width W [µm] and the distance d [µm] from the ridge bottom surface of the clad layer 108 to the active layer 105 fulfills formula (8) (more preferably, formula (9)), the effects of the present invention can be obtained.

In the nitride semiconductor laser device of this embodiment, laser oscillation occurred at a threshold current density of 1.2 [kA/cm$^2$], with a full angle at half maximum $\Theta$ of 7.0 degrees. The I-L characteristic of the nitride semiconductor laser element 10 had the same tendency as the thin line shown in FIG. 12, and, among 100 samples actually produced, about 90 maintained the fundamental lateral mode at peak outputs from 0 [mW] up to 100 [mW] within the pulse width, realizing a greatly improved yield rate as compared with conventional nitride semiconductor laser devices.

THIRD EMBODIMENT

Figure 9:
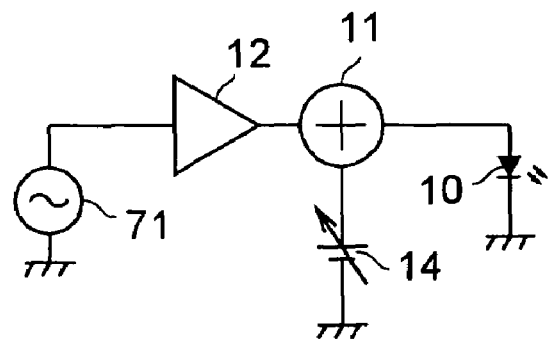
FIG. 9 is a block diagram showing an example of the internal configuration of a nitride semiconductor laser device according to the invention.
Figure 10:
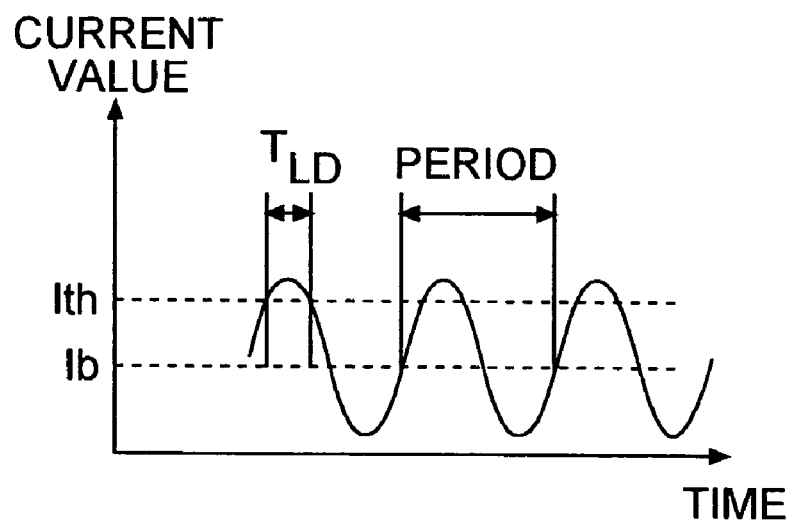
FIG. 10 is a diagram showing the time variation of the drive current supplied to the nitride semiconductor laser element provided in the nitride semiconductor laser device shown in FIG. 9.

A third embodiment of the present invention will be described below with reference to the drawings. FIG. 9 is a block diagram showing an example of the configuration of a nitride semiconductor laser device according to the invention, and FIG. 10 is a diagram showing the time variation of the current injected to the nitride semiconductor laser element. In the nitride semiconductor laser device shown in FIG. 9, such circuit elements as are found also in the nitride semiconductor laser device shown in FIG. 1 are identified with the same reference numerals, and their detailed explanations will not be repeated.

The nitride semiconductor laser device of this embodiment has the same configuration as the nitride semiconductor laser device of the first embodiment except in that, here, a high-frequency generator 71 is used in place of the pulse generator 13 (FIG. 1). Specifically, the bias current supplied from the DC current source 14 and a sinusoidal signal generated by the high-frequency generator 71 and amplified by the high-frequency amplifier 12 are mixed together by the T circuit 11 and are then fed to the nitride semiconductor laser element 10.

As a result, the nitride semiconductor laser element 10 is fed with a current that varies with time as shown in FIG. 10. Here, the duration TLD (hereinafter referred to as the "excess duration TLD") for which the drive current injected to the nitride semiconductor laser element 10 continuously remains higher than the threshold current level Ith of the nitride semiconductor laser element 10 is converted from the frequency.

The nitride semiconductor laser element 10 is structured as in the first embodiment (FIG. 3), or as in the second embodiment (FIG. 8), or in any other manner so long as it has a structure of the real refractive index waveguide type and it fulfils at least one of the following conditions: the horizontal mode confinement coefficient $\Gamma$ is in the range from 0.85 to 0.99 (more preferably, in the range from 0.88 to 0.92); the full angle at half maximum $\Theta$ of the horizontal FFP is in the range from 5 degrees to 11 degrees; and the relationship between the stripe width W [μm] and the clad layer remain film thickness d [>m] fulfills formula (8) (more preferably, formula (9)).

In the nitride semiconductor device configured as described above, as shown in FIG. 10, when the excess duration TLD of the drive current fed to the nitride semiconductor element 10 was set to be in the range from 5 [nsec] to 1,000 [nsec], and the proportion (hereinafter referred to as the "high-frequency duty factor") of the excess duration TLD within the period of the high frequency was set to be 60% or less, among 100 samples actually produced, about 90 kept the fundamental lateral mode unchanged at outputs of 0 [mW] to 100 [mW] without causing a kink.

As described above, as in the first embodiment, also with the nitride semiconductor laser device of this embodiment, it was possible to stably maintain the fundamental lateral mode up to a high output. In this embodiment also, it is preferable that the excess duration TLD be in the range from 10 [nsec] to 100 [nsec], and that the high-frequency duty factor be in the range from 10% to 60%, and more preferably in the range from 30% to 50%. Moreover, it is preferable that the average of the current level during the period other than the excess duration, i.e., the length of time for which the drive current continuously remains higher than the threshold level Ith, be 80% or less of the threshold level Ith, and more preferably in the range from 50% to 70% thereof.

In the first to third embodiments, a substrate of n-type GaN is used. It is, however, also possible to use a substrate of another material, for example a substrate formed of a single crystal of sapphire ($Al_2O_3$), spinel ($MgAl_2O_4$), SiC, MgO, Si, $ZnOMgGa_2O_4$, $LiGaO_2$, $LiAlO_2$, or ruby.

In all the embodiments, a low-temperature growth buffer layer of n-type GaN is provided. It is, however, also possible to use, instead of n-type GaN, GaN having 0 mol of $SiH_4$ introduced to it, or a film containing at least AlGaInN containing Al an In. Using these materials poses no problem at all. The low-temperature buffer layer is not an essential element of the present invention, and may thus be omitted altogether.

In all the embodiments, a low-temperature growth buffer layer of n-type GaN, an n-type optical waveguide layer, a p-type carrier block layer, a p-type optical waveguide layer, and a p-type contact layer of p-type GaN are provided. It is, however, also possible to replace these layers with layers of other nitride semiconductor materials or any other materials. These layers are not essential elements of the present invention, and therefore any of them may be omitted.

The present invention is applicable to a nitride semiconductor laser element having any other optical waveguide structure than those specifically dealt with above, so long as it has a structure of the real refractive index waveguide type and it fulfills one of the following conditions: r is in the range from 0.85 to 0.99 (more preferably, in the range from 0.88 to 0.92); $\Theta$ is in the range from 5 degrees to 11 degrees; and the relationship between the stripe width W [μm] and the distance d [μm] from the ridge bottom surface of the clad layer 108 to the active layer 105 fulfils formula (8) (more preferably, formula (9)). Thus, the same effects as described above are obtained regardless of whether the nitride semiconductor laser element has a self aligned structure (SAS) as in the first embodiment, a ridge structure as in the second embodiment, an electrode stripe structure, a buried hetero structure (BH), a channeled substrate planar (CSP) structure, or any other structure.

EXAMPLE OF APPLICATION TO A SEMICONDUCTOR OPTICAL DEVICE

Figure 11:
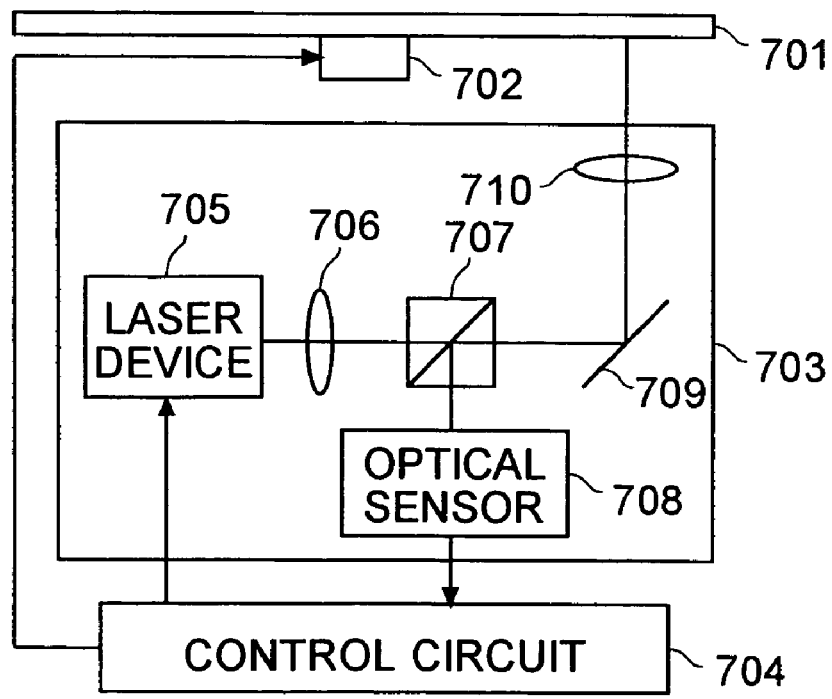
FIG. 11 is a block diagram showing the internal configuration of an optical information recording/reproducing device.

Now, an example of how a nitride semiconductor laser element according to the present invention as described above is applied to a semiconductor optical device such as an optical pickup system will be described below with reference to the drawings. FIG. 11 is a block diagram showing the internal configuration of the semiconductor optical device of this example. In the following description of this example, it is assumed that the nitride semiconductor laser element is used in an optical information recording/reproducing device. For simplicity's sake, in FIG. 11, such blocks and elements as are not necessary for the explanation of the effects of the present invention are omitted.

The optical information recording/reproducing device shown in FIG. 11 includes: a spindle motor 702 that rotates an optical disk 701 in a direction circumferential thereto; an optical pickup 703 that irradiates the optical disk 701 with laser light to read information therefrom; and a control circuit 704 that controls the device as a whole. The optical pickup 703 is moved in a direction radial to the optical disk 701 by an unillustrated actuator that is driven by the control circuit 704.

In this optical disk device, the optical pickup 703 is composed of: a nitride semiconductor laser device 705, configured as in one of the first to third embodiments, that outputs laser light; a collimator lens 706 that forms the laser light from the nitride semiconductor laser device 705 into a parallel beam; a beam splitter 707 that transmits the laser light from the nitride semiconductor laser device 705 and directs the laser light from a follower mirror 709 to an optical sensor 708; an optical sensor 708 that senses the laser light from the beam splitter 707 and feeds a detection signal to the control circuit 704; a follower mirror 709 that directs the laser light from the nitride semiconductor laser device 705 to the optical disk 701 and directs the laser light reflected from the optical disk 701 to the beam splitter 707; and an objective lens 710 that focuses the laser light from the follower mirror 709 on the optical disk 701.

The nitride semiconductor laser device 705 includes: a nitride semiconductor laser element 10 of which the horizontal mode confinement coefficient $\Gamma$ is in the range from 85% to 98%; and a pulse generator 13 or high-frequency generator 71 that generates a current waveform such that the excess duration, i.e., the length of time during which the drive current injected to the nitride semiconductor laser element 10 continuously remains higher than the threshold level Ith thereof, is in the range of 5 [nsec] to 1,000 [nsec].

In the optical information recording/reproducing device configured as described above, during a recording or erasing operation, the laser light outputted from the nitride semiconductor laser device 705 is modulated according to the inputted information from the control circuit 704, is then formed into a substantially or nearly parallel beam by the collimator lens 706, is then transmitted through the beam splitter 707, and is then reflected from the follower mirror 709 so as to be focused through the objective lens 710 on the information recording surface of the optical disk 701. As a result, to the information recording surface of the optical disk 701 the information is written in the form of bits by magnetic modulation or refractive index modulation.

On the other hand, during a reproducing operation, through steps similar to those gone through during a recording or erasing operation, the laser light emitted from the nitride semiconductor laser device 705 is focused on the information recording surface of the optical disk 701 on which information is recorded in the form of a series of depressions and elevations or by magnetic modulation or refractive index modulation. The laser light focused on the information recording surface of the optical disk 701 is then reflected therefrom, is then, through the objective lens 710, reflected from the follower mirror 709, and is then transmitted through the beam splitter 707 so as to strike the optical sensor 708, which then converts the optically detected signal into an electrical signal, achieving the reading of the recorded information.

In the optical information recording/reproducing device of this example, during a recording operation, the incidence of defects was as low as $10^{-6}$ or less; during a reproducing operation, it was possible to read out the written information at a bit read error rate of $10^{-6}$. By contrast, in an optical information recording/reproducing device provided with a nitride semiconductor laser device that does not conform to the present invention, the incidence of defects during a recording operation and the bit error rate during a reproducing operation were both of the order of $10^{-3}$. The difference resulted from the fact that the use of an optical information recording/reproducing device according to the present invention permitted the use of a nitride semiconductor laser device that maintained the fundamental lateral mode oscillation up to a high output and that had an I-L characteristic free from a kink up to a high output, and thus made it possible to stabilize the power of the laser light focused on the optical disk, resulting in a reduced defect incidence and a reduced bit read error rate.

The nitride semiconductor laser elements of the first to third embodiments can be applied not only in optical information recording/reproducing apparatuses having an optical pickup system as the one dealt with in the example described above but also in laser printers, bar code readers, projectors employing lasers of three primary colors of light (blue, green, and red), and the like.

INDUSTRIAL APPLICABILITY

According to the present invention, a nitride semiconductor laser element maintains the lateral mode up to a high output, and thus does not cause instability. This makes it possible to increase the current level at which a kink occurs in the I-L characteristic of the nitride semiconductor laser element, and thus makes it possible to manufacture, with an improved yield rate, a nitride semiconductor laser device having an I-L characteristic that is linear up to a high output. By providing such a nitride semiconductor laser device in an semiconductor optical device, it is possible to provide it with a light source that stably generates laser light even at a high optical output.

The invention claimed is:

1. A nitride semiconductor laser device comprising:
   a nitride semiconductor laser element having a horizontal light confinement ridge structure; and
   a current supply that supplies the nitride semiconductor laser element with a high-frequency drive current,
   wherein a current generated by the current supply has a waveform such that a duration for which the current continuously remains higher than a threshold current level of the nitride semiconductor laser element is 100 nsec or lower.

2. A nitride semiconductor laser device as claimed in claim 1, wherein a horizontal light confinement coefficient of the nitride semiconductor laser element is in a range from 85% to 99%.

3. A nitride semiconductor laser device as claimed in claim 2, wherein, in the waveform of the current generated by the current supply, a proportion, relative to a period of the waveform, of the duration for which the current continuously remains higher than the threshold current level of the nitride semiconductor laser element is 60% or less.

4. A nitride semiconductor laser device as claimed in claim 3, wherein the proportion, relative to the period of the waveform, of the duration for which the current continuously remains higher than the threshold current level of the nitride semiconductor laser element is in a range from 30% to 50%.

5. A nitride semiconductor laser device comprising:
   a nitride semiconductor laser element having a horizontal light confinement ridge structure; and
   a current supply that supplies the nitride semiconductor laser element with a high-frequency drive current,
   wherein a current generated by the current supply has a waveform such that a duration for which the current continuously remains higher than a threshold current level of the nitride semiconductor laser element is 1,000 nsec or lower,
   wherein a horizontal light confinement coefficient of the nitride semiconductor laser element is 85% or more but 99% or less, and
   wherein, in the waveform of the current generated by the current supply, an average current level during a period other than the duration for which the current continuously remains higher than the threshold current level of the nitride semiconductor laser element is 80% or less of the threshold current level of the nitride semiconductor laser element.

6. A nitride semiconductor laser device as claimed in claim 5, wherein the average current level during the period other than the duration for which the current continuously remains higher than the threshold current level of the nitride semiconductor laser element is in a range from 50% to 70%, both ends inclusive, of the threshold current level of the nitride semiconductor laser element.

7. A nitride semiconductor laser device as claimed in claim 2, wherein the waveform of the current generated by the current supply is rectangular.

8. A nitride semiconductor laser device as claimed in claim 2, wherein the waveform of the current generated by the current supply is sinusoidal.

9. A nitride semiconductor laser device, comprising:
   a nitride semiconductor laser element having a horizontal light confinement ridge structure, and
   a current supply that supplies the nitride semiconductor laser element with a high-frequency drive current,
   wherein a current generated by the current supply has a waveform such that a duration for which the current continuously remains higher than a threshold current level of the nitride semiconductor laser element is 1,000 nsec or lower, wherein a full angle at half maximum of a horizontal far-field pattern of the nitride semiconductor laser element is in a range from 5 degrees to 11 degrees.

10. A nitride semiconductor laser device as claimed in claim 9, wherein, in the waveform of the current generated by the current supply, a proportion, relative to a period of the waveform, of the duration for which the current continuously remains higher than the threshold current level of the nitride semiconductor laser element is 60% or less.

11. A nitride semiconductor laser device as claimed in claim 10, wherein the proportion, relative to the period of the waveform, of the duration for which the current continuously remains higher than the threshold current level of the nitride semiconductor laser element is in a range from 30% to 50%, both ends inclusive.

12. A nitride semiconductor laser device as claimed in claim 9, wherein, in the waveform of the current generated by the current supply, an average current level during a period other than the duration for which the current continuously remains higher than the threshold current level of the nitride semiconductor laser element is 80% or less of the threshold current level of the nitride semiconductor laser element.

13. A nitride semiconductor laser device as claimed in claim 12, wherein an average current level during the period other than the duration for which the current continuously remains higher than the threshold current level of the nitride semiconductor laser element is in a range from 50% to 70%, of the threshold current level of the nitride semiconductor laser element.

14. A nitride semiconductor laser device as claimed in claim 9, wherein the waveform of the current generated by the current supply is rectangular.

15. A nitride semiconductor laser device as claimed in claim 9, wherein the waveform of the current generated by the current supply is sinusoidal.

16. A nitride semiconductor laser device comprising:
a nitride semiconductor laser element having a horizontal light confinement ridge structure; and
a current supply that supplies the nitride semiconductor laser element with a high-frequency drive current,
wherein a current generated by the current supply has a waveform such that a duration for which the current continuously remains higher than a threshold current level of the nitride semiconductor laser element nsec or lower, and wherein the following equations:

$$-0.15783 + W \times 0.11555 + W^2 \times (-0.0084423)$$
$$< d \leq 0.040665 \times \exp(1.1403 \times W),$$

$$0.5 \leq W \leq 4.0, \text{ and}$$

$$0 \leq d \leq 0.5.$$

are simultaneously fulfilled where W represents a width of a horizontal light confinement ridge stripe structure of the nitride semiconductor laser element in μm and d represents a distance from a ridge bottom surface of the horizontal light confinement ridge stripe structure to an active layer in μm.

17. A nitride semiconductor laser device as claimed in claim 16, wherein, in the waveform of the current generated by the current supply, a proportion, relative to a period of the waveform, of the duration for which the current continuously remains higher than the threshold current level of the nitride semiconductor laser element is 60% or less.

18. A nitride semiconductor laser device as claimed in claim 17, wherein the proportion, relative to the period of the waveform, of the duration for which the current continuously remains higher than the threshold current level of the nitride semiconductor laser element is in a range from 30% to 50%.

19. A nitride semiconductor laser device as claimed in claim 16, wherein, in the waveform of the current generated by the current supply, an average current level during a period other than the duration for which the current continuously remains higher than the threshold current level of the nitride semiconductor laser element is 80% or less of the threshold current level of the nitride semiconductor laser element.

20. A nitride semiconductor laser device as claimed in claim 19, wherein the average current level during the period other than the duration for which the current continuously remains higher than the threshold current level of the nitride semiconductor laser element is in a range from 50% to 70%; of the threshold current level of the nitride semiconductor laser element.

21. A nitride semiconductor laser device as claimed in claim 16, wherein the waveform of the current generated by the current supply is rectangular.

22. A nitride semiconductor laser device as claimed in claim 16, wherein the waveform of the current generated by the current supply is sinusoidal.

* * * * *